(12) United States Patent
Zhang (10) Patent No.: US 7,217,634 B2
(45) Date of Patent: May 15, 2007

(54) METHODS OF FORMING INTEGRATED CIRCUITRY

(75) Inventor: Jianping Zhang, Bristow, VA (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 11/059,770

(22) Filed: Feb. 17, 2005

(65) Prior Publication Data
US 2006/0183294 A1    Aug. 17, 2006

(51) Int. Cl.
*H01L 21/76* (2006.01)
(52) U.S. Cl. .................. 438/429; 438/404; 438/424
(58) Field of Classification Search .............. 438/404, 438/405, 413, 424, 429, 431
See application file for complete search history.

(56) References Cited

U.S. PATENT DOCUMENTS

| | | | |
|---|---|---|---|
| 3,990,927 A | 11/1976 | Montier | |
| 4,474,975 A | 10/1984 | Clemons et al. | |
| 5,105,253 A | 4/1992 | Pollock | |
| 5,156,881 A | 10/1992 | Okano et al. | |
| 5,182,221 A | 1/1993 | Sato | |
| 5,387,539 A | 2/1995 | Yang et al. | |
| 5,410,176 A | 4/1995 | Liou et al. | |
| 5,470,798 A | 11/1995 | Ouellet | |
| 5,604,149 A | 2/1997 | Paoli et al. | |
| 5,616,513 A | 4/1997 | Shepard | |
| 5,702,977 A | 12/1997 | Jang et al. | |
| 5,719,085 A | 2/1998 | Moon et al. | |
| 5,741,740 A | 4/1998 | Jang et al. | |
| 5,770,469 A | 6/1998 | Uram et al. | |
| 5,776,557 A | 7/1998 | Okano et al. | |
| 5,786,039 A | 7/1998 | Brouquet | |
| 5,786,263 A | 7/1998 | Perera | |
| 5,801,083 A | 9/1998 | Yu et al. | |
| 5,863,827 A | 1/1999 | Joyner | |
| 5,883,006 A | 3/1999 | Iba | |
| 5,888,880 A | 3/1999 | Gardner et al. | |
| 5,895,253 A | 4/1999 | Akram | |
| 5,895,255 A | 4/1999 | Tsuchiaki | |
| 5,904,540 A | 5/1999 | Sheng et al. | |

(Continued)

FOREIGN PATENT DOCUMENTS

EP    0817251 A    1/1998

(Continued)

OTHER PUBLICATIONS

Beekmann et al., *Sub-micron Gap Fill and in-Situ Planarisation Using Flowfill™ Technology*, Electrotech 1-7 ULSI Conference, Portland, OR (Oct. 1995).

(Continued)

*Primary Examiner*—Phuc T. Dang
(74) *Attorney, Agent, or Firm*—Wells St. John P.S.

(57) ABSTRACT

The invention includes methods of forming integrated circuitry. In one implementation, a method of forming an integrated circuit includes forming a plurality of isolation trenches within semiconductive silicon-comprising material. The isolation trenches comprise sidewalls comprising exposed semiconductive silicon-comprising material. An epitaxial silicon-comprising layer is grown from the exposed semiconductive silicon-comprising material sidewalls within the isolation trenches. Electrically insulative trench isolation material is formed within the isolation trenches over the epitaxially-grown silicon-comprising layer. Other aspects and implementations are contemplated.

37 Claims, 10 Drawing Sheets

U.S. PATENT DOCUMENTS

| | | | |
|---|---|---|---|
| 5,923,073 | A | 7/1999 | Aoki et al. |
| 5,930,645 | A | 7/1999 | Lyons et al. |
| 5,930,646 | A | 7/1999 | Gerung et al. |
| 5,943,585 | A | 8/1999 | May et al. |
| 5,950,094 | A | 9/1999 | Lin et al. |
| 5,960,299 | A | 9/1999 | Yew et al. |
| 5,972,773 | A | 10/1999 | Liu et al. |
| 5,976,949 | A | 11/1999 | Chen |
| 5,981,354 | A | 11/1999 | Spikes et al. |
| 5,989,978 | A | 11/1999 | Peidous |
| 5,998,280 | A | 12/1999 | Bergemont et al. |
| 6,013,583 | A | 1/2000 | Ajmera et al. |
| 6,030,881 | A | 2/2000 | Papasouliotis et al. |
| 6,033,961 | A | 3/2000 | Xu et al. |
| 6,051,477 | A | 4/2000 | Nam |
| 6,090,675 | A | 7/2000 | Lee et al. |
| 6,156,674 | A | 12/2000 | Li et al. |
| 6,171,962 | B1 | 1/2001 | Karlsson et al. |
| 6,187,651 | B1 | 2/2001 | Oh |
| 6,190,979 | B1 * | 2/2001 | Radens et al. ............. 438/301 |
| 6,191,002 | B1 | 2/2001 | Koyanagi |
| 6,300,219 | B1 | 10/2001 | Doan et al. |
| 6,326,282 | B1 | 12/2001 | Park et al. |
| 6,329,266 | B1 | 12/2001 | Hwang et al. |
| 6,355,966 | B1 | 3/2002 | Trivedi |
| 6,448,150 | B1 | 9/2002 | Tsai et al. |
| 6,455,394 | B1 | 9/2002 | Iyer et al. |
| 6,534,395 | B2 | 3/2003 | Werkhoven et al. |
| 6,583,028 | B2 | 6/2003 | Doan et al. |
| 6,583,060 | B2 | 6/2003 | Trivedi |
| 6,617,251 | B1 | 9/2003 | Kamath et al. |
| 6,719,012 | B2 | 4/2004 | Doan et al. |
| 2001/0006255 | A1 | 7/2001 | Kwon et al. |
| 2001/0006839 | A1 | 7/2001 | Yeo |
| 2001/0041250 | A1 | 11/2001 | Haukka et al. |
| 2001/0046753 | A1 | 11/2001 | Gonzales et al. |
| 2002/0000195 | A1 | 1/2002 | Kao et al. |
| 2002/0004284 | A1 | 1/2002 | Chen |
| 2002/0018849 | A1 | 2/2002 | George et al. |
| 2003/0032281 | A1 | 2/2003 | Werkhoven et al. |
| 2003/0129826 | A1 | 7/2003 | Werkhoven et al. |
| 2004/0032006 | A1 | 2/2004 | Yun et al. |
| 2004/0082181 | A1 | 4/2004 | Doan et al. |
| 2004/0209484 | A1 | 10/2004 | Hill et al. |
| 2004/0266153 | A1 | 12/2004 | Yongjun |
| 2005/0009368 | A1 | 1/2005 | Vaarstra |
| 2005/0054213 | A1 | 3/2005 | Derderian et al. |
| 2005/0079730 | A1 | 4/2005 | Beintner et al. |
| 2005/0112282 | A1 | 5/2005 | Gordon et al. |
| 2005/0124171 | A1 | 6/2005 | Vaarstra |
| 2005/0142799 | A1 * | 6/2005 | Seo ............................. 438/424 |

FOREIGN PATENT DOCUMENTS

| | | |
|---|---|---|
| JP | 02277253 A | 11/1990 |
| JP | 05-315441 | 11/1993 |
| JP | 06-334031 | 12/1994 |
| JP | 146224 | 1/1996 |
| WO | 02/27063 A2 | 4/2002 |

OTHER PUBLICATIONS

Curtis, et al., *APCVD TEOS: $O_3$ Advanced Trench Isolation Applications*, Semiconductor Fabtech, 9th Ed., pp. 241-247 (pre-Jul. 2003).

Disclosed Anonymous 32246, *Substrate Contact With Closed Bottom Trenches*, Research Disclosure, 1 page (Feb. 1991).

Gasser et al., *Quasi-monolayer deposition of silicon dioxide*, 250 Thin Solid Films, pp. 213-218 (1994).

George et al., *Atomic layer controlled deposition of $SiO_2$ and $Al_2O_2$ using ABAB . . . binary reaction sequence Chemistry*, 82/83 Applied Surface Science, pp. 460-467 (1994).

Hasumann et al., *Catalytic vapor deposition of highly conformal silica nanolaminates*, Department of Chemistry and Chemical Biology, Harvard University, pp. 1-13 (May 14, 2002).

Chen et al., *Excimer Laser-Induced Ti Silicidation to Eliminate the Fine-Line Effect for Integrated Circuity Device Fabrication*, 149 Journal of Electrochemical Society, No. 11, pp. G609-G612 (2002).

Nishiyama et al., *Agglomeration Resistant Self-Aligned Silicide Process Using $N_2$ Implantation into $TiSi_2$*, 36 Jpn. J. Appl. Phys., Part 1, No. 6A, pp. 3639-3643 (Jun. 1997).

Wolf, *Chapter 13: Polycides and Salicides of TiSix, CoSi2, and NiSi*, Silicon Processing for the VLSI Era, vol. IV, pp. 603-604 (pre-2003).

Hausmann et al., *Rapid Vapor Deposition of Highly Conformal Silica Nanolaminates*, 298 Science, pp. 402-406 (Oct. 11, 2002).

Horie et al., *Kinetics and Mechanism of the Reactions of $O(^3P)$ with $SiH_4$, $CH_3SiH_3$, $(CH_3)_2SiH_2$, and $(CH_3)_2SiH$*, 95 J. Phys. Chem., pp. 4393-4400 (1991).

Joshi et al., *Plasma Deposited Organosilicon Hydride Network Polymers as Versatile Resists for Entirely Dry Mid-Deep UV Photolithography*, 1925 SPIE, pp. 709-720 (1993).

PCT/US2004/021156; Filed Jun. 30, 2004 Search Report.

Kiermasz et al., *Planarisation for Sub-Micron Devices Utilising a New Chemistry*, 1-2 Electrotech, DUMIC Conference, California (Feb. 1995).

Klaus et al., *Atomic Layer Deposition of $SiO_2$ Using Catalyzed and Uncatalyzed Self-Limiting Surface Reactions*, 6 Surface Review and Letters, Nos. 3 & 4, pp. 435-448 (1999).

Kojima et al., *Planarization Process Using a Multi-Coating of Spin-on-Glass*, V-MIC Conference, California, 2 pages (1995).

Matsuura et al., *A Highly Reliable Self-planarizing Low-k Intermetal Dielectric for Sub-quarter Micron Interconnects*, IEEE, pp. 785-788 (1997).

Matsuura et al., *Novel Self-planarizing CVD Oxide for Interlayer Dielectric Applications*, IEEE, pp. 117-120 (1994).

McClatchie et al., *Low Dielectric Constant Flowfill™ Technology for IMD Applications*, 7 pps. (pre-Aug. 1999).

Miller et al., *Self-limiting chemical vapor deposition of an ultra-thin silicon oxide film using bi-(tert-butoxy) silanol*, 397 Thin Solid Films, pp. 78-82 (2001).

Morishita et al., *Atomic-layer chemical-vapor-deposition of silicon-nitride*, 112 Applied Surface Science, pp. 189-204 (1997).

Shareef et al., *Subatmospheric chemical vapor deposition ozone/TEOS process for $SiO_2$ trench filling*, J. Vac. Sci. Technol. B 13(4), pp. 1888-1995 (Jul./Aug. 1995).

U.S. Appl. No. 10/806,923, filed Mar. 22, 2004, Li et al.

U.S. Appl. No. 10/931,524, filed Aug. 31, 2004, Sandhu.

Withnall et al., *Matrix Reactions of Methylsilanes and Oxygen Atoms*, 92 J. Phys. Chem., pp. 594-602, 1988.

Yokoyama et al., *Atomic layer controlled deposition of silicon nitride and in situ growth observation by infrared reflection absorption spectroscopy*, 112 Applied Surface Science, pp. 75-81 (1997).

* cited by examiner

METHODS OF FORMING INTEGRATED CIRCUITRY

TECHNICAL FIELD

This invention relates to methods of forming integrated circuitry.

BACKGROUND OF THE INVENTION

In the fabrication of integrated circuitry, numerous devices are packed into a single small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. Conventional methods of isolating circuit components include trench isolation. Such is typically formed by etching trenches into a semiconductor substrate and filling the trenches with insulative material. As the density of components on the semiconductor substrate has increased, the widths of the trenches have decreased. Further, it is not uncommon to find different areas of a substrate having different width and/or different depth isolation trenches. Also and regardless, some areas of integrated circuitry have greater minimum active area spacing between isolation trenches than do other areas.

Trenches are typically fabricated utilizing a trench isolation mask comprising silicon nitride and silicon dioxide. Etching of the isolation trenches essentially forms an upper corner where the trench sidewall meets the upper or outer surface of the semiconductive material within which the trenches are formed. Such can lead to several adverse effects. For example, mechanical stress is induced from the etch and can generate crystalline dislocations and dopant redistribution in such corner regions. Such can lead to a parasitic leakage path, and the sidewalls of the isolation trenches are typically roughened by the etching. Further, a typical gate oxide layer tends to thin at the sharp corners, and gate polysilicon wrap-around can generate a parasitic device with increasing corner conduction and degraded dielectric integrity.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming integrated circuitry. In one implementation, a method of forming an integrated circuit includes forming a plurality of isolation trenches within semiconductive silicon-comprising material. The isolation trenches comprise sidewalls comprising exposed semiconductive silicon-comprising material. An epitaxial silicon-comprising layer is grown from the exposed semiconductive silicon-comprising material sidewalls within the isolation trenches. Electrically insulative trench isolation material is formed within the isolation trenches over the epitaxially-grown silicon-comprising layer. Other aspects and implementations are contemplated.

BRIEF DESCRIPTION OF THE DRAWINGS

Preferred embodiments of the invention are described below with reference to the following accompanying drawings.

FIG. 3 is a view of the FIG. 2 substrate at a processing step subsequent to that depicted by FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
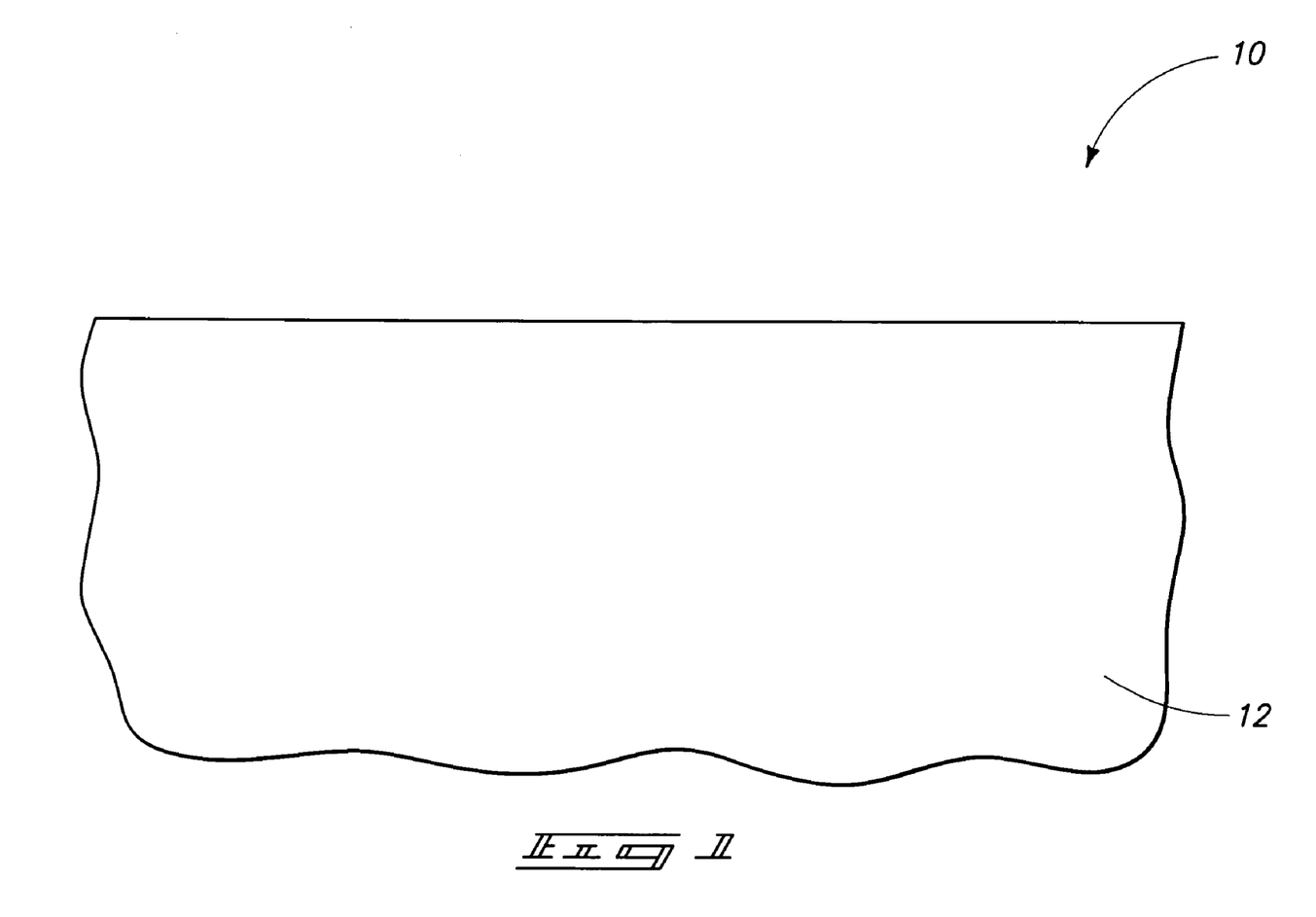
FIG. 1 is a diagrammatic section of a semiconductor wafer fragment in process in accordance with an aspect of the invention.

The invention contemplates methods of forming integrated circuits comprising trench isolation. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the depicted exemplary embodiment, substrate 10 comprises semiconductive silicon-comprising material 12. One particular example is a bulk monocrystalline silicon wafer having suitable intrinsic or background doping. The semiconductive silicon-comprising material might include additional materials, such as germanium, by way of example only. While depicted bulk semiconductor substrate processing is preferred, such is exemplary only. Other processing is also contemplated, for example, and by way of example only, semiconductor-on-insulator substrates.

Figure 2:
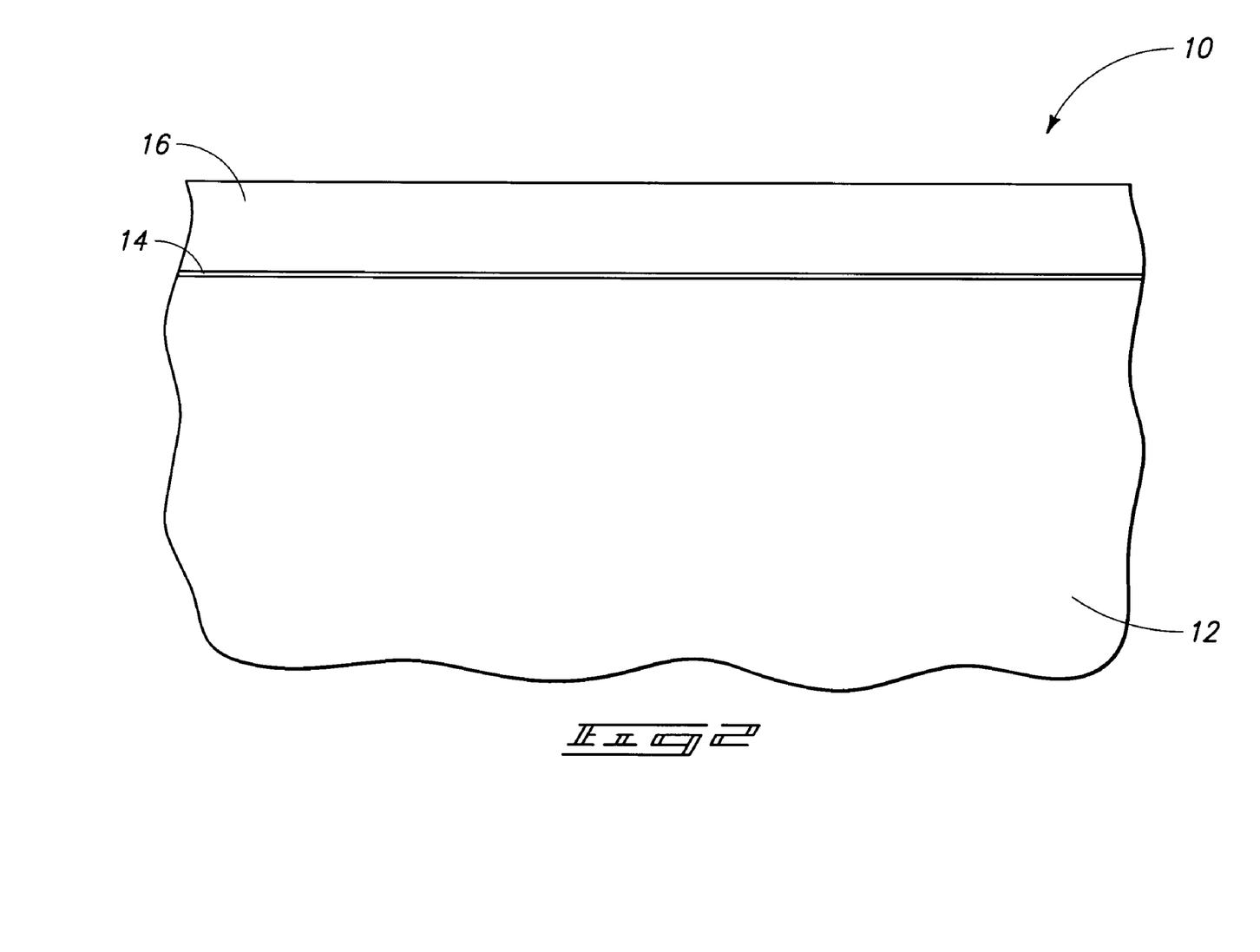
FIG. 2 is a view of the FIG. 1 substrate at a processing step subsequent to that depicted by FIG. 1.

Referring to FIG. 2, a pad oxide layer 14 and a silicon nitride-comprising layer 16 have been formed over semiconductive silicon-comprising material 12. In the depicted exemplary embodiment, pad oxide layer 14 has been formed "on" semiconductive silicon-comprising material 12, with "on" in the context of this document meaning in at least some direct physical, touching contact therewith. An exemplary preferred pad oxide material is thermally-grown silicon dioxide having an exemplary thickness range from 75 Angstroms to 150 Angstroms, with 96 Angstroms being a specific example. Layer 16 typically comprises silicon nitride deposited to an exemplary thickness range of from 450 Angstroms to 550 Angstroms, with 500 Angstroms being a specific example.

Referring to FIG. 3, pad oxide layer 14 and silicon nitride-comprising layer 16 have been patterned effective to form the depicted trench isolation mask 17 (i.e., the collection of the illustrated blocks of materials 14 and 16) over semiconductive silicon-comprising material 12. By way of example only, an exemplary preferred technique includes photolithographic patterning and etch, and wherein the photoresist is shown as having been removed in FIG. 3. The formation of other trench isolation masks, including any other techniques for forming the same, are also of course contemplated.

Figure 4:
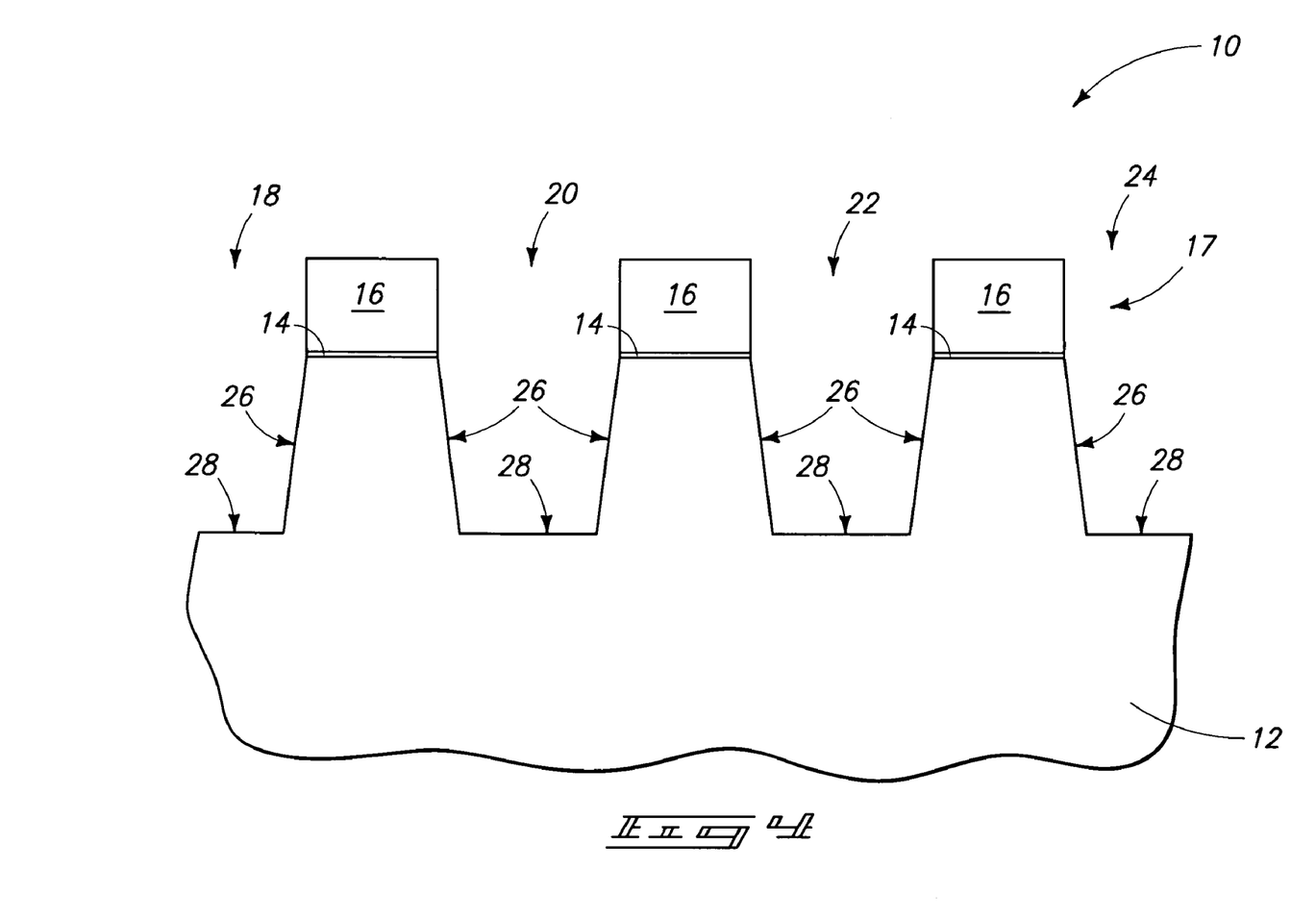
FIG. 4 is a view of the FIG. 3 substrate at a processing step subsequent to that depicted by FIG. 3.

Referring to FIG. 4, a plurality of isolation trenches 18, 20, 22 and 24 have been etched within semiconductive silicon-comprising material 12 using trench isolation mask 17 as a mask during such etching. An exemplary depth range for the isolation trenches from the outermost surface of material 12 is from 3,400 Angstroms to 3,800 Angstroms. Any suitable existing or yet-to-be developed dry anisotropic etching chemistry would be usable. The above provides but one exemplary method of forming a plurality of isolation trenches within the semiconductive silicon-comprising material. However, any existing or yet-to-be developed method of forming a plurality of isolation trenches is contemplated, including with or without using a trench isolation mask. Isolation trenches 18, 20, 22 and 24 comprise trench sidewalls 26 which comprise exposed semiconductive silicon-comprising material 12. Further in the depicted preferred embodiment, isolation trenches 18, 20, 22 and 24 comprise bases 28 comprising exposed semiconductive silicon-comprising material 12.

Figure 5:
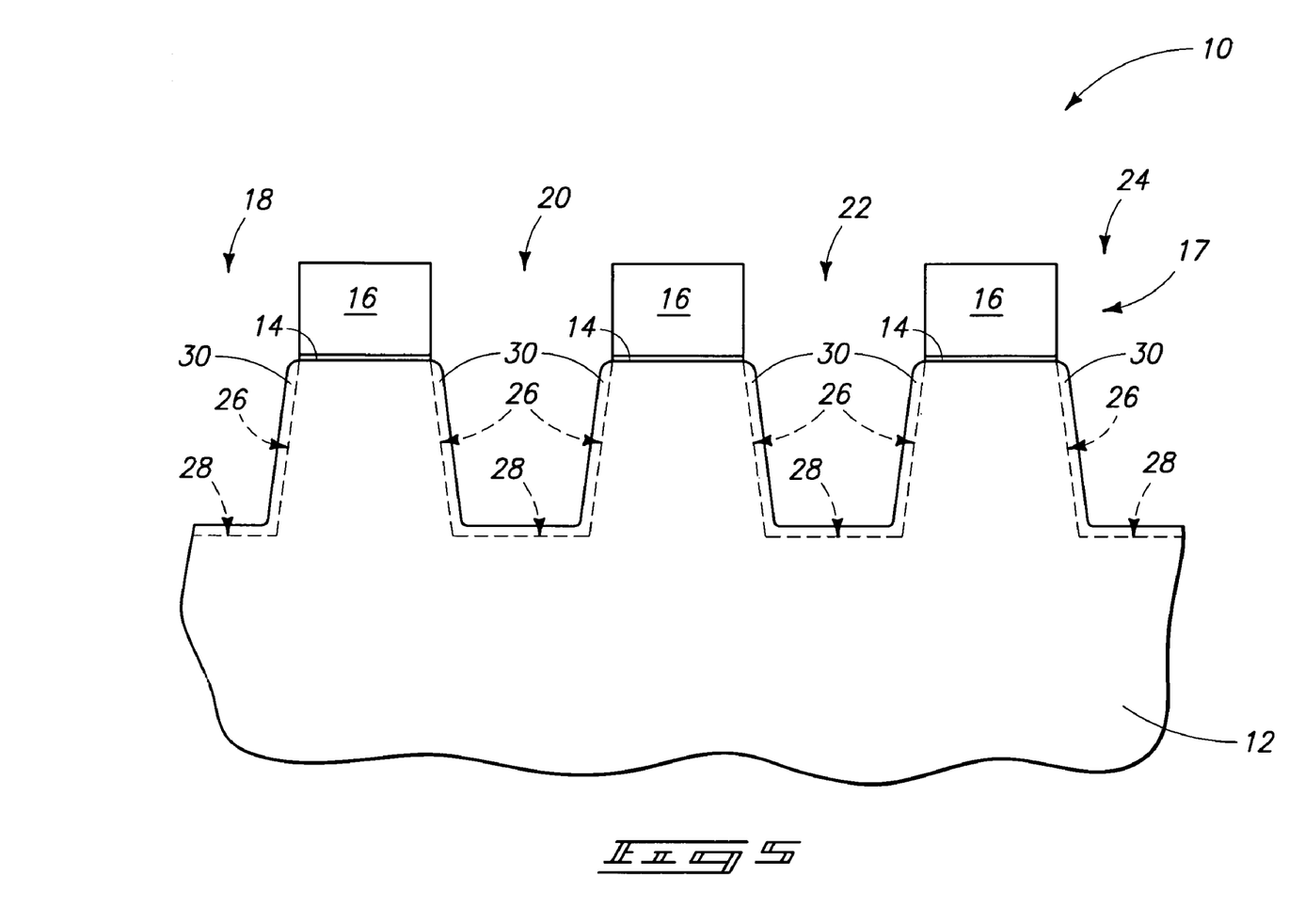
FIG. 5 is a view of the FIG. 4 substrate at a processing step subsequent to that depicted by FIG. 4.

Referring to FIG. 5, an epitaxial silicon-comprising layer 30 has been grown at least from exposed semiconductive silicon-comprising material sidewalls 26 within the isolation trenches, and also preferably as shown from exposed bases 28. Also preferably, such occurs as shown while at least some of trench isolation mask 17 remains on the substrate over the semiconductive silicon-comprising material. A preferred thickness range for epitaxially-grown silicon-comprising layer 30 is from about 50 Angstroms to about 300 Angstroms, with a thickness of at least 100 Angstroms being preferred, and of at least 150 Angstroms being even more preferred. Any existing or yet-to-be developed method of forming an epitaxially-grown silicon-comprising layer could be utilized. By way of example only, and in accordance with an aspect of the invention, one preferred technique includes an initial exposure of the semiconductive silicon-comprising material to $H_2$, for example at a substrate temperature of from 800° C. to 900° C. and an $H_2$ flow rate of from 300 sccm to 10 slm in a single wafer processor. Preferably, such treatment will tend to heal or cure dopant and crystal dislocations which might be created during the etch of the trenches, for example as described in the Background section above. Such hydrogen treatment is preferably followed by a chlorine-containing cleaning, for example using $Cl_2$ or HCl at an exemplary flow rate of from 300 sccm to 1 slm. A preferred temperature range for the chlorine treatment is from 680° C. to 850° C. at an exemplary pressure range of from 1 Torr to 20 Torr. Epitaxial silicon can be grown at the same temperature or pressure (for example at 850° C.) utilizing silane, disilane, and/or dichlorosilane as exemplary silicon-containing precursors. An exemplary flow rate for such a precursor(s) is from 200 sccm to 650 sccm in a single wafer processor, with 300 sccm being a specific example.

Figure 6:
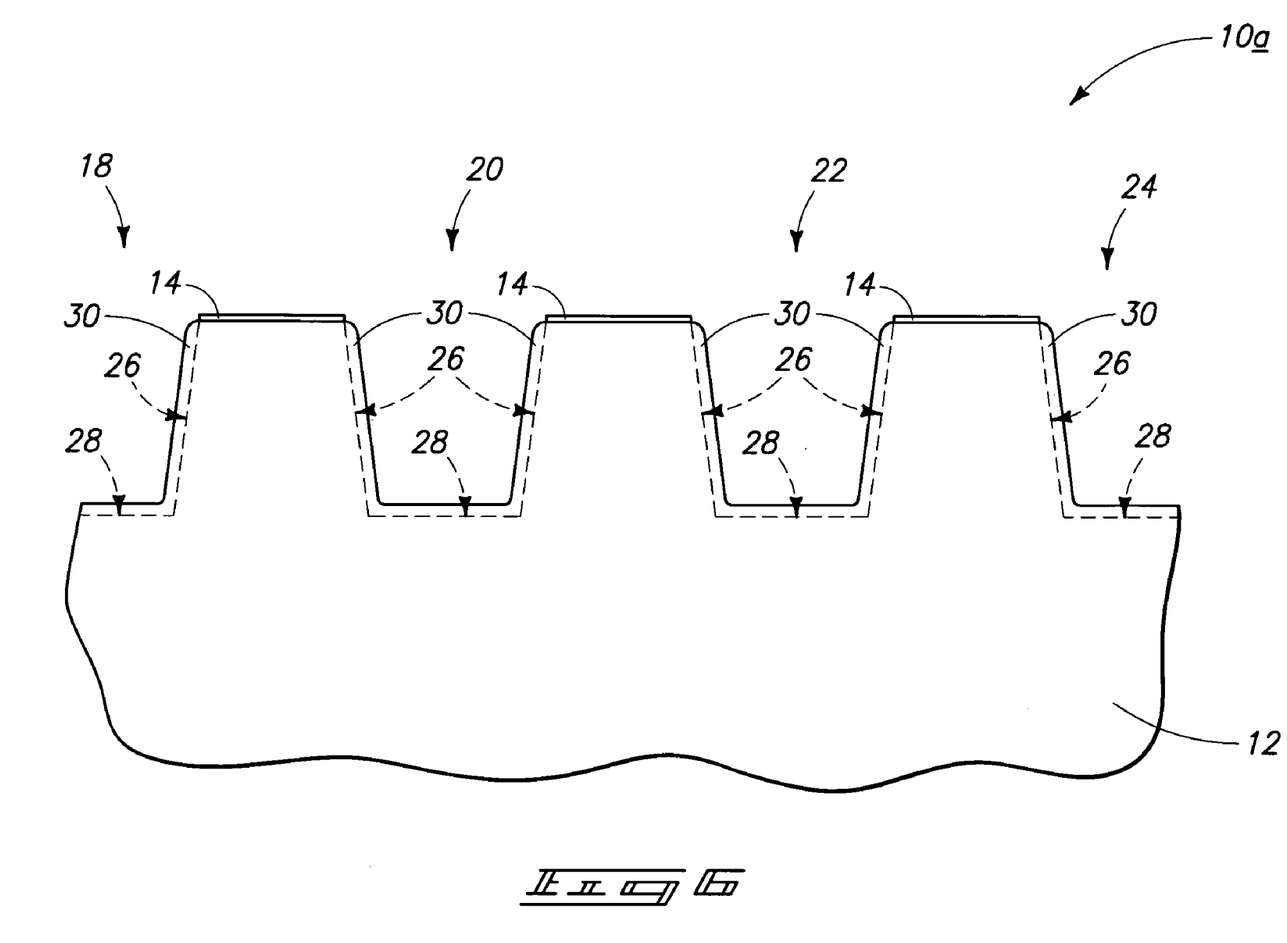
FIG. 6 is a diagrammatic section of an alternate semiconductor wafer fragment in process in accordance with an aspect of the invention.

Preferably, at least some of isolation mask 17 remains on the substrate during the epitaxial growth, with all of such isolation mask 17 being depicted as remaining in FIG. 5. Alternately by way of example only, none or only some of the trench isolation mask might remain during the epitaxial growth. For example and by way of example only, FIG. 6 depicts an alternate embodiment substrate 10a. Like numerals have otherwise been utilized from the first embodiment. FIG. 6 differs from that of FIG. 5 in that silicon nitride-comprising layer 16 has been removed prior to epitaxial silicon growth of silicon-comprising layer 30, and, as well, at least some of silicon dioxide-comprising layer 14 has been left over semiconductive silicon-comprising material 12 during the epitaxial growing.

Figure 7:
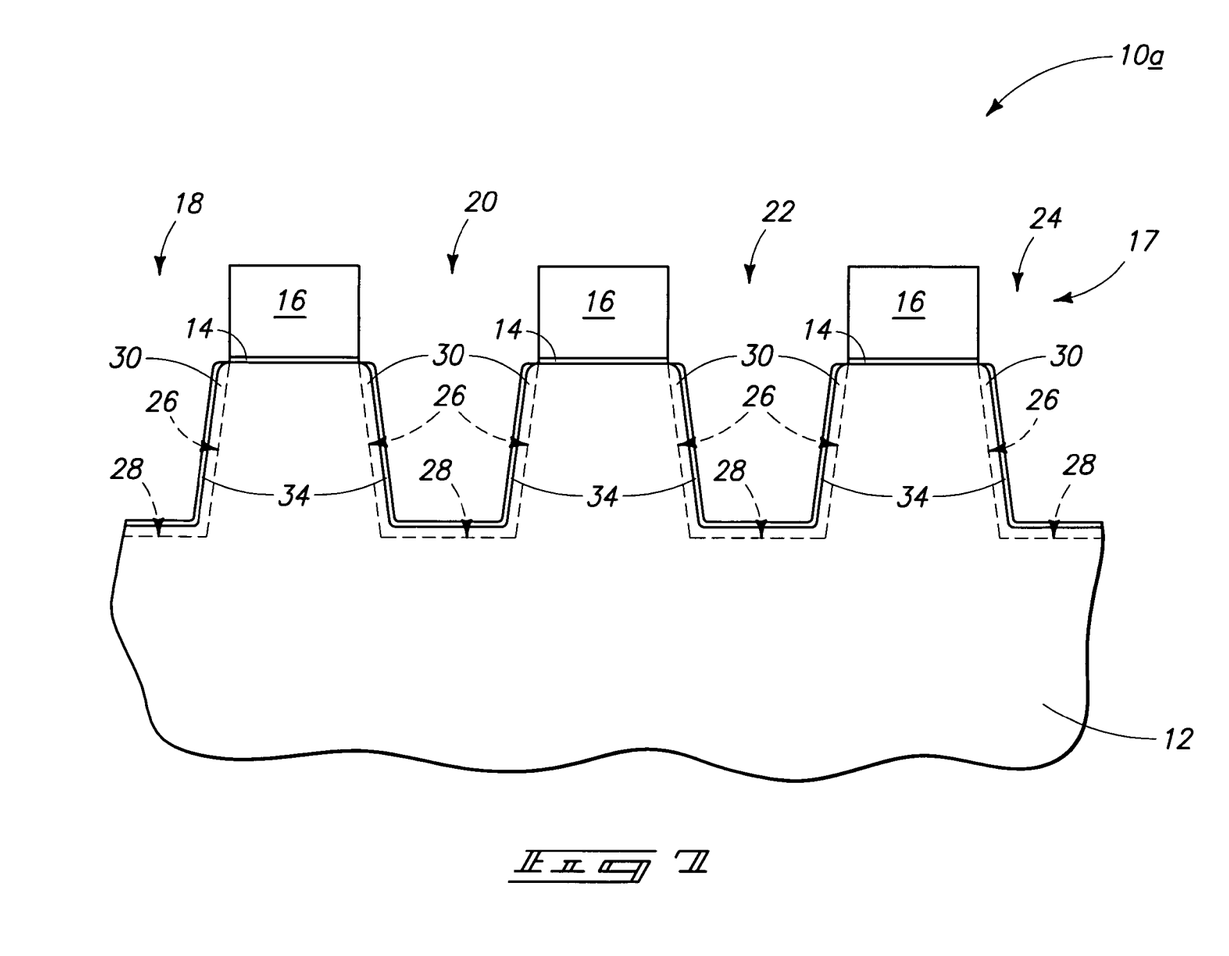
FIG. 7 is a view of the FIG. 5 substrate at a processing step subsequent to that depicted by FIG. 5.

Electrically insulative trench isolation material is formed within the isolation trenches over the epitaxially-grown silicon-comprising layer. By way of example only, exemplary preferred embodiments of doing so are described with reference to FIGS. 7–10. Referring to FIG. 7, a silicon dioxide-comprising layer 34 has been thermally grown over, and preferably on as shown, epitaxially-grown silicon-comprising layer 30. An exemplary preferred thickness range for layer 34 is from 50 Angstroms to 70 Angstroms. An exemplary preferred technique comprises atmospheric oxidation using $O_2$, and a temperature of from 750° C. to 850° C.

Figure 8:
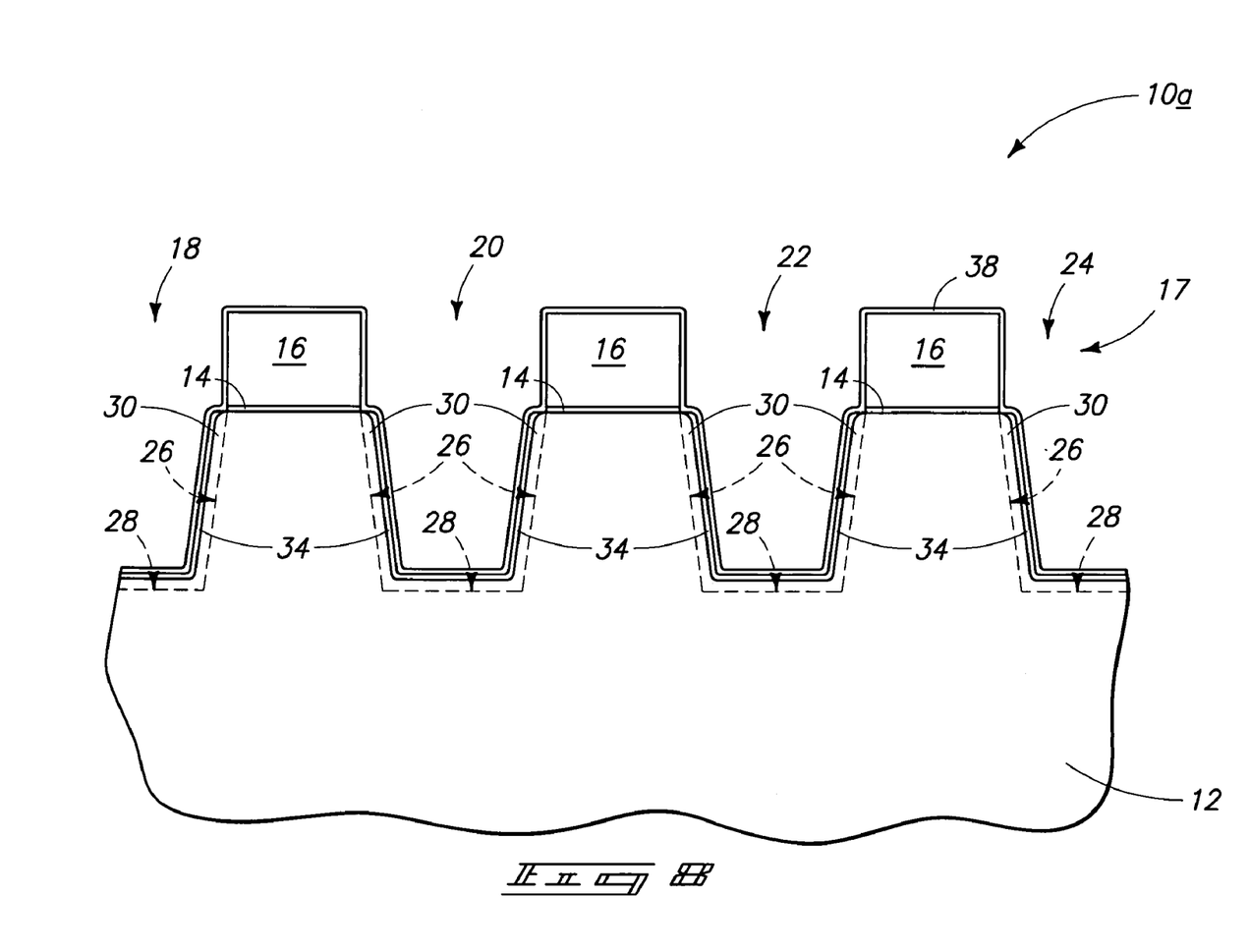
FIG. 8 is a view of the FIG. 7 substrate at a processing step subsequent to that depicted by FIG. 7.

Referring to FIG. 8, a silicon nitride-comprising layer 38 has been formed over epitaxially-grown silicon-comprising layer 30. Further preferably as shown, layer 38 is formed over, and preferably on, thermally-grown silicon dioxide-comprising layer 34. An exemplary preferred technique for forming a silicon nitride-comprising layer 38 is by low pressure chemical vapor deposition using ammonia and dichlorolsilane as precursor gases. An exemplary preferred temperature range is from 550° C. to 650° C., with a preferred pressure range being from 1,000 mTorr to 1,500 mTorr. Further, as shown in FIG. 8, silicon nitride-comprising layer 38 is also deposited over at least some of trench isolation mask 17 remaining over the semiconductive silicon-comprising material.

Figure 9:
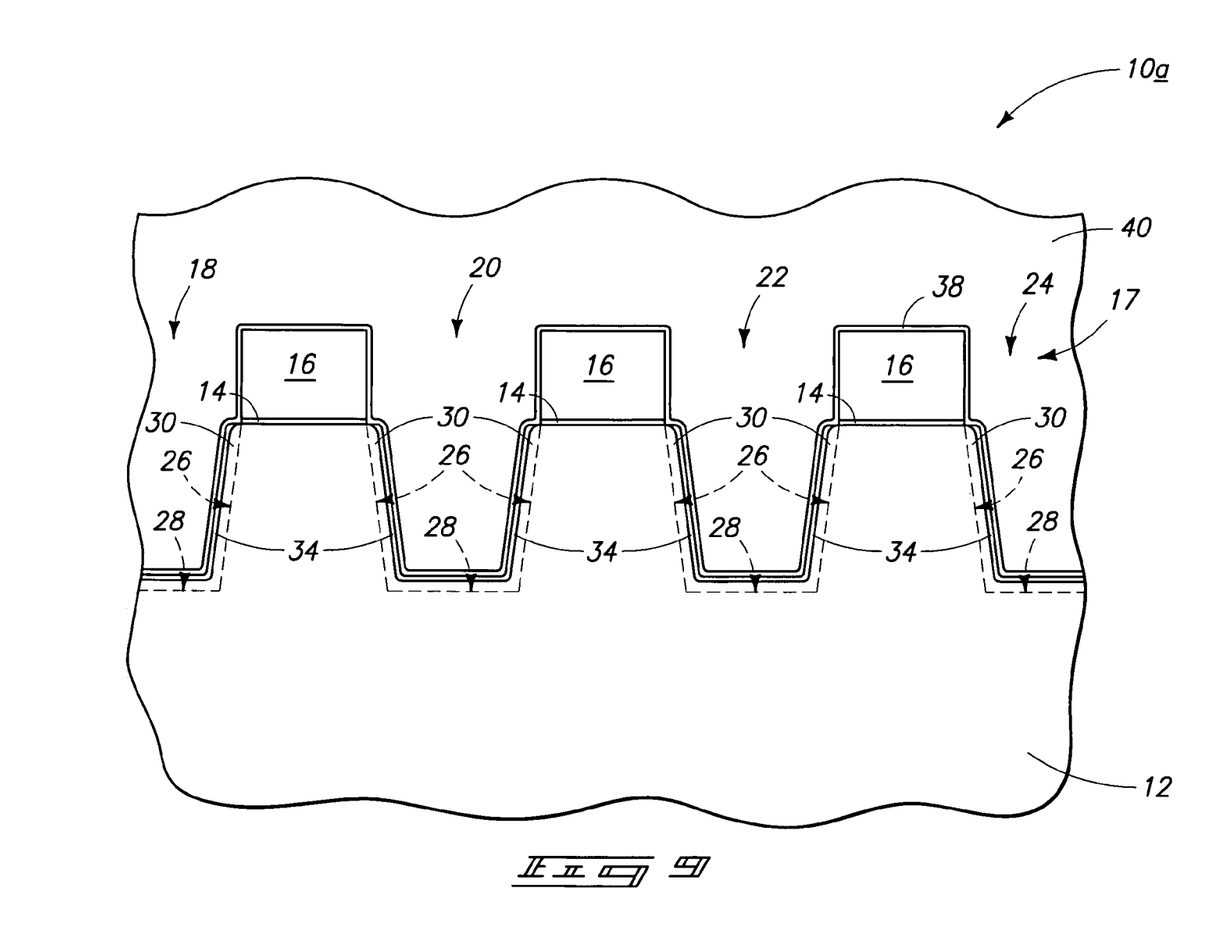
FIG. 9 is a view of the FIG. 8 substrate at a processing step subsequent to that depicted by FIG. 8.

Referring to FIG. 9, another insulative layer 40 has been deposited over the substrate effective to fill the remaining volume of isolation trenches 18, 20, 22 and 24. Any suitable existing or yet-to-be developed material could be used. By way of example only, preferred materials include silicon dioxide-comprising material, for example high density plasma deposited silicon dioxide and/or spin-on-dielectrics comprising silicon dioxide and/or other materials.

Figure 10:
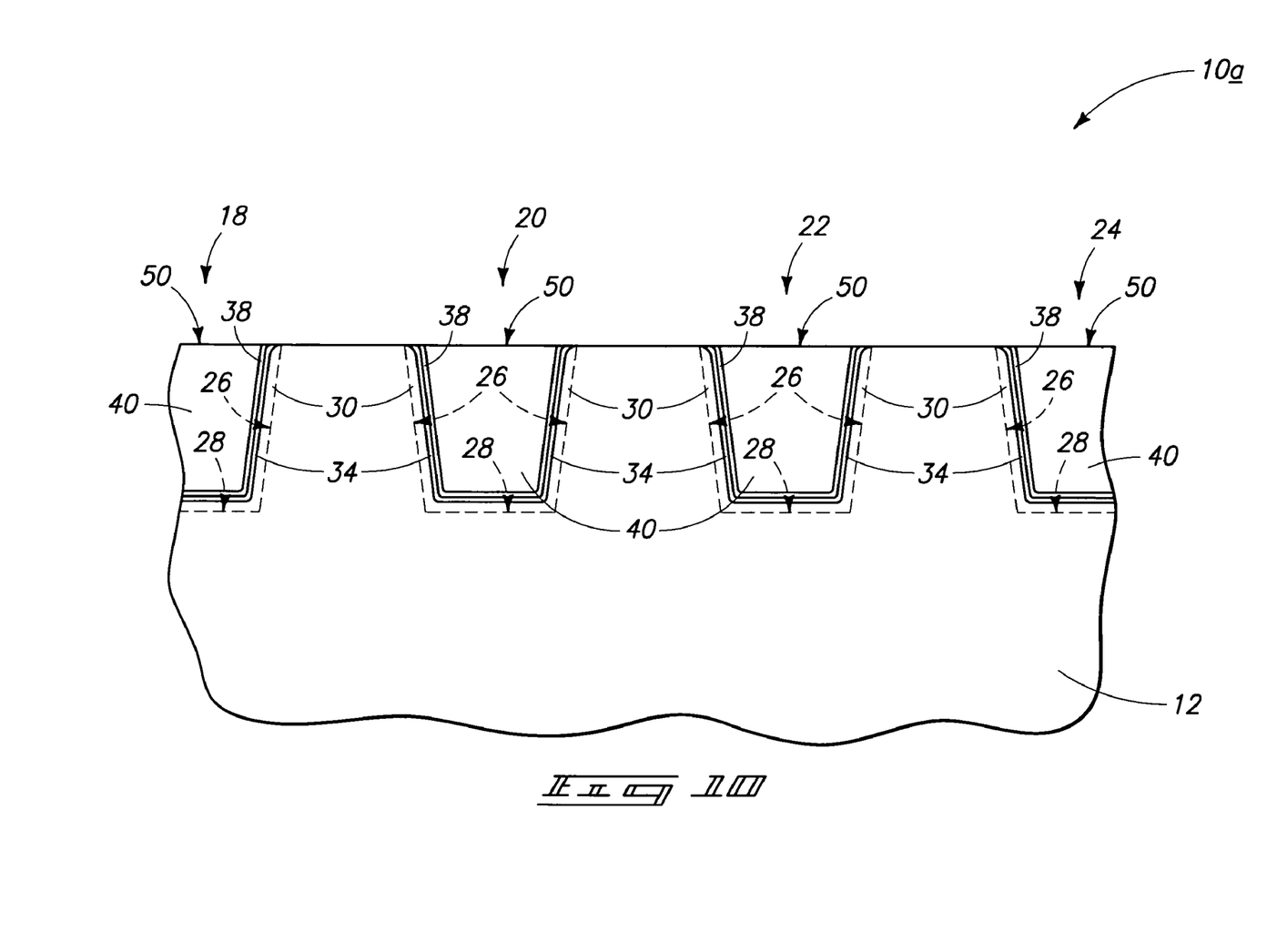
FIG. 10 is a view of the FIG. 9 substrate at a processing step subsequent to that depicted by FIG. 9.

Referring to FIG. 10, the substrate has been planarized (i.e., preferably by chemical mechanical polishing) to leave trench isolation material 50 (comprising a composite of layers 40, 38 and 34) remaining in isolation trenches 18, 20, 22 and 24. Of course, more, fewer and/or other materials might be utilized as electrically insulative trench isolation material. Further, such might include one or more semiconductive materials as a part thereof.

In accordance with one preferred aspect, fabrication of the depicted epitaxially-grown silicon-comprising layer can have the effect of rounding the upper corner of the isolation trenches, and hopefully, improve gate oxide thinning and gate polysilicon wrap-around. Further, the epitaxial silicon might act as a buffer layer and smooth the trench sidewalls, thereby reducing stress caused by the formation of the trench isolation material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an integrated circuit, comprising:
   forming a plurality of isolation trenches within semiconductive silicon-comprising material, the isolation trenches comprising sidewalls comprising exposed semiconductive silicon-comprising material;
   growing an epitaxial silicon-comprising layer from the exposed semiconductive silicon-comprising material sidewalls within the isolation trenches; and
   forming electrically insulative trench isolation material within the isolation trenches over the epitaxially-grown silicon-comprising layer, the forming the electrically insulative trench isolation material comprising thermally growing a silicon dioxide-comprising layer over the epitaxially-grown silicon-comprising layer.

2. The method of claim 1 wherein the semiconductive silicon-comprising material comprises germanium.

3. The method of claim 1 wherein the semiconductive silicon-comprising material comprises bulk monocrystalline silicon.

4. The method of claim 3 wherein the semiconductive silicon-comprising material comprises germanium.

5. The method of claim 1 wherein the isolation trenches comprise bases comprising exposed semiconductive silicon-comprising material, the epitaxially-grown silicon-comprising layer also growing from the exposed semiconductive silicon-comprising material bases.

6. The method of claim 1 wherein the thermally-grown silicon dioxide-comprising layer is grown on the epitaxially-grown silicon-comprising layer.

7. The method of claim 1 wherein forming the electrically insulative trench isolation material comprises depositing a silicon dioxide-comprising material over the thermally-grown silicon dioxide-comprising layer.

8. A method of forming an integrated circuit, comprising:
   forming a plurality of isolation trenches within semiconductive silicon-comprising material, the isolation trenches comprising sidewalls comprising exposed semiconductive silicon-comprising material;
   growing an epitaxial silicon-comprising layer from the exposed semiconductive silicon-comprising material sidewalls within the isolation trenches; and
   forming electrically insulative trench isolation material within the isolation trenches over the epitaxially-grown silicon-comprising layer, the forming the electrically insulative trench isolation material comprising depositing a silicon nitride-comprising layer over the epitaxially-grown silicon-comprising layer.

9. The method of claim 8 wherein forming the electrically insulative trench isolation material comprises thermally growing a silicon dioxide-comprising layer, the silicon nitride-comprising layer being formed over the thermally-grown silicon dioxide-comprising layer.

10. The method of claim 9 wherein the silicon nitride-comprising layer is formed on the thermally-grown silicon dioxide-comprising layer.

11. The method of claim 1 wherein the epitaxially-grown silicon-comprising layer is of a thickness from about 50 Angstroms to about 300 Angstroms.

12. The method of claim 1 wherein the epitaxially-grown silicon-comprising layer is of a thickness of at least 100 Angstroms.

13. The method of claim 1 wherein the epitaxially-grown silicon-comprising layer is of a thickness of at least 150 Angstroms.

14. A method of forming an integrated circuit, comprising:
   forming a plurality of isolation trenches within semiconductive silicon-comprising material, the isolation trenches comprising sidewalls comprising exposed semiconductive silicon-comprising material;
   exposing the semiconductive silicon-comprising material within the trenches to an atmosphere comprising $H_2$;
   after exposing the semiconductive silicon-comprising material to an atmosphere comprising $H_2$, growing an epitaxial silicon-comprising layer from the exposed semiconductive silicon-comprising material sidewalls within the isolation trenches; and
   forming electrically insulative trench isolation material within the isolation trenches over the epitaxially-grown silicon-comprising layer.

15. A method of forming an integrated circuit, comprising:
   forming a trench isolation mask over semiconductive silicon-comprising material, the trench isolation mask comprising a silicon nitride-comprising layer formed over a silicon dioxide-comprising layer;
   using the trench isolation mask, etching a plurality of isolation trenches within the semiconductive silicon-comprising material, the isolation trenches comprising sidewalls comprising exposed semiconductive silicon-comprising material;
   removing the silicon nitride-comprising layer;
   after removing the silicon nitride-comprising layer, growing an epitaxial silicon-comprising layer from the exposed semiconductive silicon-comprising material sidewalls within the isolation trenches; and
   forming electrically insulative trench isolation material within the isolation trenches over the epitaxially-grown silicon-comprising layer.

16. The method of claim 15 wherein the growing occurs while at least some of the trench isolation mask remains over the semiconductive silicon-comprising material.

17. The method of claim 15 comprising leaving at least some of the silicon dioxide-comprising layer over the semiconductive silicon-comprising material during said growing.

18. A method of forming an integrated circuit, comprising:
   forming a trench isolation mask over semiconductive silicon-comprising material;
   using the trench isolation mask, etching a plurality of isolation trenches within the semiconductive silicon-comprising material, the isolation trenches comprising sidewalls comprising exposed semiconductive silicon-comprising material;
   growing an epitaxial silicon-comprising layer from the exposed semiconductive silicon-comprising material sidewalls within the isolation trenches; and
   forming electrically insulative trench isolation material within the isolation trenches over the epitaxially-grown silicon-comprising layer, the forming the electrically insulative trench isolation material comprising depositing a silicon nitride-comprising layer over the epitaxially-grown silicon-comprising layer.

19. The method of claim 18 wherein the growing occurs while at least some of the trench isolation mask remains over the semiconductive silicon-comprising material, the silicon nitride-comprising layer being deposited over the at least some of the trench isolation mask remaining over the semiconductive silicon-comprising material.

20. The method of claim 15 wherein the isolation trenches comprise bases comprising exposed semiconductive silicon-comprising material, the epitaxially-grown silicon-comprising layer also growing from the exposed semiconductive silicon-comprising material bases.

21. A method of forming an integrated circuit, comprising:
forming a trench isolation mask over semiconductive silicon-comprising material;
using the trench isolation mask, etching a plurality of isolation trenches within the semiconductive silicon-comprising material, the isolation trenches comprising sidewalls comprising exposed semiconductive silicon-comprising material;
growing an epitaxial silicon-comprising layer from the exposed semiconductive silicon-comprising material sidewalls within the isolation trenches; and
forming electrically insulative trench isolation material within the isolation trenches over the epitaxially-grown silicon-comprising layer, the forming the electrically insulative trench isolation material comprising thermally growing a silicon dioxide-comprising layer over the epitaxially-grown silicon-comprising layer.

22. The method of claim 21 wherein the thermally-grown silicon-dioxide comprising layer is grown on the epitaxially-grown silicon-comprising layer.

23. The method of claim 21 wherein forming the electrically insulative trench isolation material comprises depositing a silicon nitride-comprising layer over the epitaxially-grown silicon-comprising layer.

24. The method of claim 23 wherein the silicon nitride-comprising layer is formed on the thermally-grown silicon dioxide-comprising layer.

25. The method of claim 15 wherein the epitaxially-grown silicon-comprising layer is of a thickness from about 50 Angstroms to about 300 Angstroms.

26. The method of claim 15 wherein the epitaxially-grown silicon-comprising layer is of a thickness of at least 100 Angstroms.

27. The method of claim 15 wherein the epitaxially-grown silicon-comprising layer is of a thickness of at least 150 Angstroms.

28. A method of forming an integrated circuit, comprising:
forming a trench isolation mask over semiconductive silicon-comprising material;
using the trench isolation mask, etching a plurality of isolation trenches within the semiconductive silicon-comprising material, the isolation trenches comprising sidewalls comprising exposed semiconductive silicon-comprising material;
exposing the semiconductive silicon-comprising material within the trenches to an atmosphere comprising $H_2$;
growing an epitaxial silicon-comprising layer from the exposed semiconductive silicon-comprising material sidewalls within the isolation trenches; and
forming electrically insulative trench isolation material within the isolation trenches over the epitaxially-grown silicon-comprising layer.

29. A method of forming an integrated circuit, comprising:
forming a trench isolation mask over semiconductive silicon-comprising material, the trench isolation mask comprising a silicon nitride-comprising layer formed over a silicon dioxide-comprising layer;
using the trench isolation mask, etching a plurality of isolation trenches within the semiconductive silicon-comprising material, the isolation trenches comprising sidewalls comprising exposed semiconductive silicon-comprising material;
after completing said etching, removing at least some of the silicon nitride-comprising layer;
after said removing, growing an epitaxial silicon-comprising layer from the exposed semiconductive silicon-comprising material sidewalls within the isolation trenches; and
forming electrically insulative trench isolation material within the isolation trenches over the epitaxially-grown silicon-comprising layer.

30. The method of claim 29 wherein the growing occurs while at least some of the trench isolation mask remains over the semiconductive silicon-comprising material.

31. The method of claim 29 comprising leaving at least some of the silicon dioxide-comprising layer over the semiconductive silicon-comprising material during said growing.

32. The method of claim 29 wherein forming the electrically insulative trench isolation material comprises depositing a silicon nitride-comprising layer over the epitaxially-grown silicon-comprising layer.

33. The method of claim 29 wherein forming the electrically insulative trench isolation material comprises thermally growing a silicon dioxide-comprising layer over the epitaxially-grown silicon-comprising layer.

34. The method of claim 33 wherein the thermally-grown silicon-dioxide comprising layer is grown on the epitaxially-grown silicon-comprising layer.

35. The method of claim 33 wherein forming the electrically insulative trench isolation material comprises depositing a silicon nitride-comprising layer over the epitaxially-grown silicon-comprising layer.

36. The method of claim 35 wherein the silicon nitride-comprising layer is formed on the thermally-grown silicon dioxide-comprising layer.

37. The method of claim 29 comprising exposing the semiconductive silicon-comprising material to an atmosphere comprising $H_2$ prior to said growing.

* * * * *